(12) United States Patent
    Franca-Neto (10) Patent No.: US 8,988,918 B2
(45) Date of Patent: *Mar. 24, 2015

(54) HIGH CURRENT CAPABLE ACCESS DEVICE FOR THREE-DIMENSIONAL SOLID-STATE MEMORY

(71) Applicant: HGST Netherlands B.V., Amsterdam (NL)

(72) Inventor: Luiz M. Franca-Neto, Sunnyvale, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/245,675

(22) Filed: Apr. 4, 2014

(65) Prior Publication Data
    US 2014/0204646 A1    Jul. 24, 2014

Related U.S. Application Data

(63) Continuation of application No. 13/358,944, filed on Jan. 26, 2012, now Pat. No. 8,767,431.

(51) Int. Cl.
    *G11C 5/06*       (2006.01)
    *G11C 13/00*      (2006.01)
    (Continued)

(52) U.S. Cl.
    CPC ............. *G11C 5/06* (2013.01); *G11C 11/5678* (2013.01); *H01L 27/2481* (2013.01);
    (Continued)

(58) Field of Classification Search
    CPC .......... G11C 5/025; G11C 5/063; G11C 7/18;
                 G11C 11/4097; G11C 5/06; G11C 13/0004

USPC ...................................................... 365/63, 72
    See application file for complete search history.

(56) References Cited

U.S. PATENT DOCUMENTS 4,908,679 A    3/1990  Vora et al.
    6,229,157 B1   5/2001  Sandhu
                   (Continued)

FOREIGN PATENT DOCUMENTS

WO    2010018888 A1    2/2010
    WO    2013033267 A1    3/2013

OTHER PUBLICATIONS

Jang et al. "Vertical Cell Array using TCAT (Terabit Cell Array Transistor) Technology for Ultra High Density NAND Flash Memory," Symposium on VLSI Technology, Digest of Technical Papers, 2009, pp. 192-193.

(Continued)

*Primary Examiner* — Hoai V Ho
*Assistant Examiner* — Tri Hoang
(74) *Attorney, Agent, or Firm* — Patterson & Sheridan, LLP (57) ABSTRACT

The present invention generally relates to three-dimensional arrangement of memory cells and methods of addressing those cells. The memory cells can be arranged in a 3D orientation such that macro cells that are in the middle of the 3D arrangement can be addressed without the need for overhead wiring or by utilizing a minimal amount of overhead wiring. An individual macro cell within a memory cell can be addressed by applying three separate currents to the macro cell. A first current is applied to the memory cell directly. A second current is applied to the source electrode of the MES-FET, and a third current is applied to the gate electrode of the MESFET to permit the current to travel through the channel of the MESFET to the drain electrode which is coupled to the memory element.

15 Claims, 8 Drawing Sheets

(51) Int. Cl.
  *G11C 11/56* (2006.01)
  *H01L 27/24* (2006.01)
  *G11C 5/02* (2006.01)
  *G11C 7/18* (2006.01)
  *G11C 11/4097* (2006.01)
  *H01L 45/00* (2006.01)

(52) U.S. Cl.
  CPC .............. *G11C 5/025* (2013.01); *G11C 5/063* (2013.01); *G11C 7/18* (2013.01); *G11C 11/4097* (2013.01); *G11C 13/0004* (2013.01); *H01L 27/2454* (2013.01); *H01L 45/06* (2013.01); *H01L 45/1233* (2013.01); *H01L 45/144* (2013.01)
  USPC ............................................. 365/63; 365/72

(56) References Cited

U.S. PATENT DOCUMENTS

| | | | |
|---|---|---|---|
| 6,501,111 | B1 | 12/2002 | Lowrey |
| 6,525,953 | B1 | 2/2003 | Johnson |
| 6,750,469 | B2 | 6/2004 | Ichihara et al. |
| 6,780,711 | B2 | 8/2004 | Johnson et al. |
| 7,391,045 | B2 | 6/2008 | Lowrey |
| 7,684,227 | B2 | 3/2010 | Liu et al. |
| 7,687,830 | B2 | 3/2010 | Pellizzer et al. |
| 7,732,801 | B2 | 6/2010 | Chen |
| 7,876,605 | B2 | 1/2011 | Bolivar et al. |
| 8,158,967 | B2 | 4/2012 | Tang et al. |
| 8,351,236 | B2 | 1/2013 | Yan et al. |
| 8,471,263 | B2 | 6/2013 | Lee |
| 2005/0230724 | A1 | 10/2005 | Hsu |
| 2009/0161420 | A1 | 6/2009 | Shepard |
| 2009/0302294 | A1 | 12/2009 | Kim |
| 2010/0061145 | A1 | 3/2010 | Weis |
| 2010/0259962 | A1 | 10/2010 | Yan et al. |
| 2010/0270529 | A1 | 10/2010 | Lung |
| 2010/0295123 | A1 | 11/2010 | Lung et al. |
| 2010/0308337 | A1 | 12/2010 | Sriram et al. |
| 2011/0006377 | A1 | 1/2011 | Lee et al. |
| 2011/0044093 | A1 | 2/2011 | Koh et al. |
| 2012/0087178 | A1* | 4/2012 | Watanabe et al. .............. 365/149 |
| 2013/0193399 | A1* | 8/2013 | Franca-Neto ...................... 257/5 |
| 2013/0194855 | A1 | 8/2013 | Franca-Neto |

OTHER PUBLICATIONS

Kau et al. "A stackable cross point phase change memory," Electron Devices Meeting (IEDM), 2009 IEEE International, pp. 27.1.1-27.1.4.

Sasago et al. "Cross-point phase change memory with 4F2 cell size driven by low-contact-resistivity poly-Si diode," Symposium on VLSI Technology, Digest of Technical Papers, 2009, pp. 24-25.

Wang et al. "Three-Dimensional 4F2 ReRAM Cell with CMOS Logic Compatible Process," Technical Digest International Electron Devices Meeting (IEDM), 2010, pp. 29.6.1-29.6.4.

Whang et al. "Novel 3-Dimensional Dual Control-Gate with Surrounding Floating-Gate (DC-SF) NAND Flash Cell for 1Tb File Storage Application," International Electron Devices Meeting (IEDM), 2010, IEEE International, 29.7.1-29.7.

Wong et al. "Phase Change Memory," Proceedings of the IEEE, vol. 98, No. 12, Dec. 2010, pp. 2201-2227.

Zhou et al. "A Durable and Energy Efficient Main Memory Using Phase Change Memory Technology," Proceedings of the 36th annual international symposium on Computer architecture, Jun. 20-24, 2009, Austin, Texas.

Katsumata et al., "Pipe-shaped BiCS Flash Memory with 16 Stacked Layers and Multi-Level-Cell Operation for Ultra High Density Storage Devices", 2009 Symposium on VLSI Technology Digest of Technical Papers, p. 136-137.

Kim et al., "Multi-Layered Vertical Gate NAND Flash Overcoming Stacking Limit for Terabit Density Storage", 2009 Symposium on VLSI Technology Digest of Technical Papers, p. 188-189.

Yaegashi et al., "20nm-node Planer MONOS Cell Technology for Multi-level NAND Flash Memory", 2009 Symposium on VLSI Technology Digest of Technical Papers, p. 190-191.

Chiu et al., "Program Charge Effect on Random Telegraph Noise Amplitude and Its Device Structural Dependence in SONOS Flash Memory", IEEE, p. 34.7.1-34.7.4.

Kim et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, p. 186-187.

Annunziata et al., "Phase Change Memory Technology for Embedded Non Volatile Memory Applications for 90nm and Beyond", IEEE, p. 5.3.1-5.3.4.

Bae et al., "1D Thickness Scaling Study of Phase Change Material (Ge2Sb2Te5) using a Psuedo 3-Terminal Device", IEEE, p. 5.2.1-5.2.4.

Fukami et al., "tow-Current Perpehdicular Domain Wall Motion Cell for Scalable High-Speed MRAM", 2009 Symposium on VLSI Technology Digest of Technical Papers, p. 230-231.

Yoon et al., "Vertical Cross-point Resistance Change Memory for Ultra-High Density Non-volatile Memory Applications", 2009 Symposium on VLSI Technology Digest of Technical Papers, p. 26-27.

Intellectual Property Office Combined Search and Examination Report for Application GB1301236.4 dated Apr. 25, 2013.

Stephen Campbell, "The Science and Engineering of Microelectronic Fabrication", 2ed., p. 414-418; No date available.

* cited by examiner

HIGH CURRENT CAPABLE ACCESS DEVICE FOR THREE-DIMENSIONAL SOLID-STATE MEMORY

CROSS-REFERENCE TO RELATED APPLICATIONS

This application claims is a continuation of U.S. patent application Ser. No. 13/358,944, filed Jan. 26, 2012, which is herein incorporated by reference.

BACKGROUND OF THE INVENTION

1. Field of the Invention

Embodiments of the present invention generally relate to three-dimensional solid-state memory and a method for addressing memory cells in a three-dimensional arrangement.

2. Description of the Related Art

Phase change memory (PCM) is a type of non-volatile memory technology. PCM is an emerging technology and a candidate for storage class memory (SCM) applications and a serious contender to dislodge NOR and NAND flash memory in solid state storage applications and, in the case of NAND flash, solid-state drives (SSDs). PCM functions based upon switching a memory cell, typically based on chalcogenides such as $Ge_2Sb_2Te_5$, between two stable states, a crystalline state and an amorphous state, by heating the memory cell. To heat the memory cell, an electrical current flows through the PCM cell. For an effective memory device, numerous PCM cells will be present in an array. Each of the PCM cells needs to be addressed, programmed and read with low overhead electrical wiring. The PCM cell is the phase-change cell itself, and PCM device, as discussed herein, is the set of PCM cells plus accompanying heaters (represented by a resistor in the electrical diagrams). The PCM device is the memory element herein.

Figure 1A:
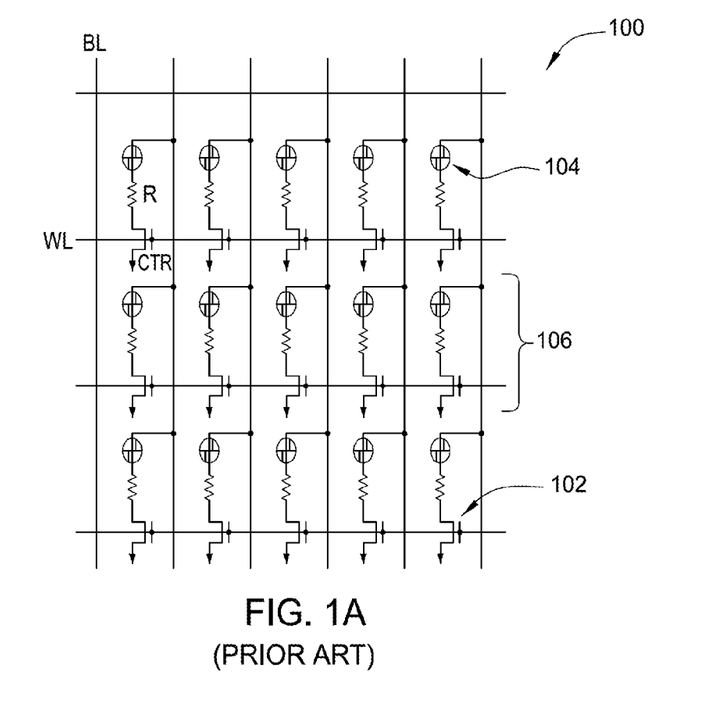
FIG. 1A is a schematic isometric view of a prior art memory cell 100.

An array 100 of PCM cells is frequently arranged with a selecting transistor 102 in series with each memory cell 104 as shown in FIG. 1A. Word lines (WL) and bitlines (BL) are arranged so that each memory cell 104 can be programmed or queried. A row of PCM cells is activated by a single word line WL and each one of the PCM cells 104 in that row will affect the bitline BL to which it is electrically connected according to the state of the PCM cells 104, i.e. according to the PCM cells 104 being in their high (amorphous) or low (crystalline) resistance state. As shown in FIG. 1A, a simple array 100 of PCM devices 106 is shown. The array 100 is a two dimensional array because the PCM devices 106 are all arranged along a common plane.

Figure 1B:
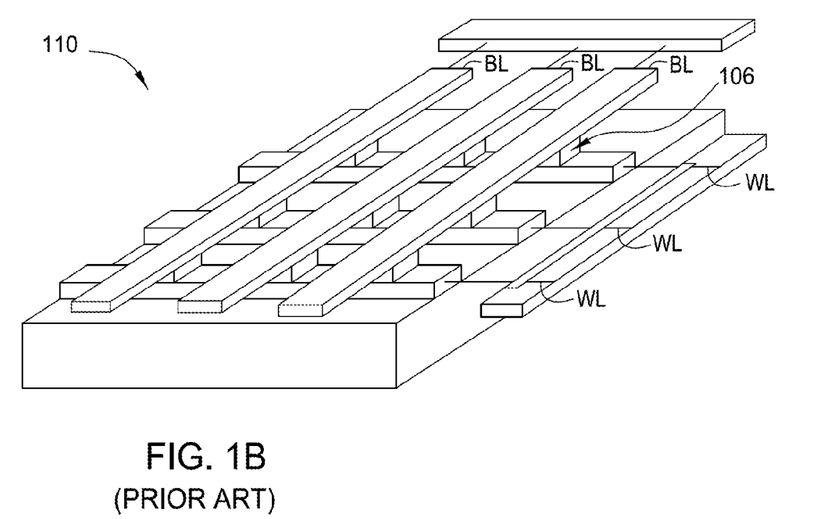
FIG. 1B is a schematic cross-sectional view of a prior art memory cell 110.

In an alternative design commonly named "cross-point", shown in FIG. 1B. Each interception of word lines WL in the x direction and bit lines BL in the y direction has a PCM device 106, which includes the PCM cell 104 itself and its heater (represented by a resistor). Frequently, a selecting device is added in series with the PCM device. This selecting device can be a diode or a transistor. The selecting device, diode or transistor, added to the cross-point array 110, or alternatively, used externally to the array of PCM cells may frequently become the limiting factor on how dense can the PCM array become.

When the selecting device is added to the cross-point array, there will be one selecting device per PCM device 106. Current requirements of the PCM device 106 need to be met by the selecting device. In consequence, even when the PCM device 106 can be made small to the lithographic limit and occupy only $4F^2$ of area, where F is the half-pitch critical dimension in a lithographic technology, the selecting device might require $30F^2$ if it is a CMOS transistor or $10F^2$ if it is a bipolar transistor. Optimized diodes, where efforts to make them very conductive might attend the current requirement of a PCM device using $4F^2$ area and are therefore very frequently considered as selecting device in cross point memories using PCM or any memory device requiring significant currents for operation.

Unfortunately, using diodes makes it very difficult to extend the concept of cross-point array 110 from a two-dimensional (2D) array to a three-dimensional (3D) array. In a 3D array, addressing the PCM devices 106 that are in the middle of the array is difficult.

Therefore, there is a need for a PCM device that permits each PCM cell to be accessed individually while minimizing the use of the surface area of the substrate over which the PCM device is disposed as well as minimizing the overhead wiring utilized to address PCM cells in the middle of the PCM 3D array.

SUMMARY OF THE INVENTION

The present invention generally relates to three-dimensional solid state memory cells and arrangements thereof. Examples of suitable three-dimensional solid state memory cells include PCM. In one embodiment, a three-dimensional solid state memory cell comprises a three-terminal device; a first electrical connector coupled to the three-terminal device, the first electrical connector extending along a first axis and a second axis perpendicular to the first axis; a second electrical connector coupled to the three-terminal device; a memory cell coupled to second electrical connector, the memory cell disposed along the second axis; and a third electrical connector coupled to the memory cell, the third electrical connector extending along the second axis and along a third axis perpendicular to both the second axis and the first axis.

In another embodiment, a method of addressing a memory cell in a three-dimensional solid state memory cell is disclosed. The memory cell comprises a three-terminal device; a first electrical connector coupled to the three-terminal device, the first electrical connector extending along a first axis and a second axis perpendicular to the first axis; a second electrical connector coupled to the three-terminal device; a memory cell coupled to second electrical connector, the memory cell disposed along the second axis; and a third electrical connector coupled to the memory cell, the third electrical connector extending along the second axis and a third axis perpendicular to both the second axis and the first axis. The method comprises applying an electrical current to the first electrical connector; applying an electrical current to the third electrical connector; and applying an electrical current to the three-terminal device.

In another embodiment, a method of addressing a memory cell in a three-dimensional solid state memory cell is disclosed. The memory cell comprises a plurality of macro cells that each comprise a three-terminal device; a first electrical connector coupled to the three-terminal device, the first electrical connector extending along a first axis and a second axis perpendicular to the first axis; a second electrical connector coupled to the three-terminal device; a memory cell coupled to second electrical connector, the memory cell disposed along the second axis; and a third electrical connector coupled to the memory cell, the third electrical connector extending along the second axis and a third axis perpendicular to both the second axis and the first axis. The method comprises applying a first electrical current to the first electrical connectors of a first plurality of macro cells; applying a second electrical current to the second electrical connectors of a second plurality of macro cells; and applying a third electrical current to the three-terminal devices of a third plurality of macro cells, wherein the first electrical current, the second electrical current and the third electrical current are collectively applied to a single macro cell.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 2:
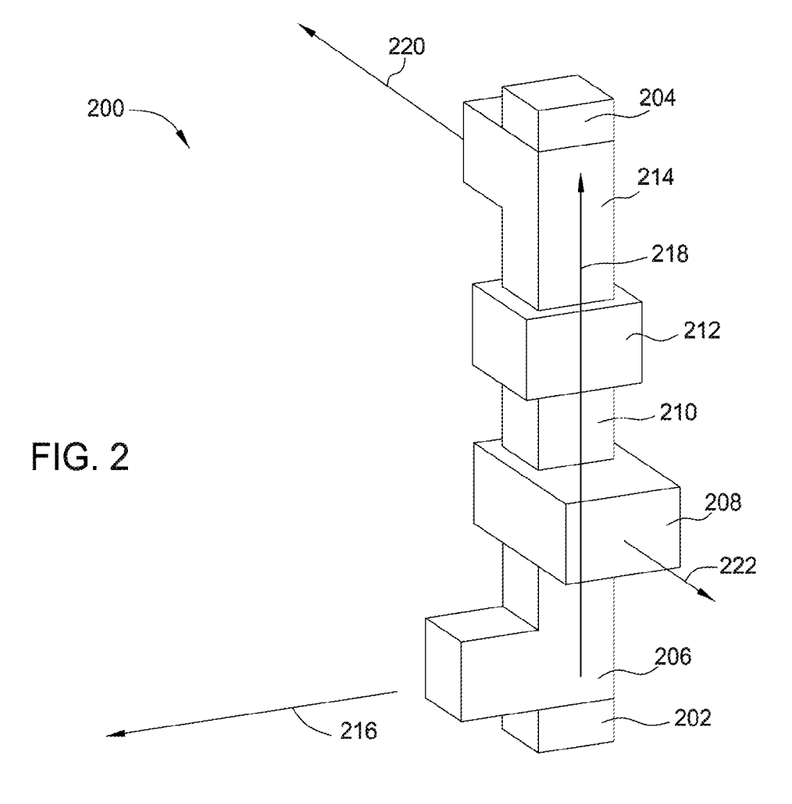
FIG. 2 is an isometric illustration of a macro cell 200 for use in a PCM cell according to one embodiment.

The present invention generally relates to a PCM cell and arrangements thereof. The PCM cell is used as illustrative purposes only. It is contemplated that other memory cells like tunnel magneto-resistive (TMR) cells, or other memory cell element where information is stored by its change of resistance, could be used without departing from the spirit of the invention. In the case of spin-transfer torque TMR, current for the switching of the cell needs to be applied in two directions, and such a requirement will also be attended by the invention in this patent application. A PCM-based building block as used herein is comprised of numerous macro cells. FIG. 2 is an isometric illustration of a macro cell 200 according to one embodiment. The macro cell 200 includes an electrically insulating spacer 202 at the bottom of the macro cell 200 in order to electrically insulate the macro cell 200 from underlying conductive material, such as transistors or adjacent macro cells. Suitable materials that may be utilized for the electrically insulating spacer 202 include silicon dioxide, silicon nitride, and silicon oxynitride.

The macro cell 200 also includes a selecting three-terminal device 208, which could be a MESFET. As will be discussed below, the three-terminal selecting device 208 will have its gate electrode if it is a MESFET coupled to a control device external to the three-dimensional array to deliver electrical voltage or current to the gate electrode of that three-terminal device 208. The three-terminal device 208 is electrically coupled to a first electrical connector 206. The first electrical connector extends along a first axis 216 as well as a second axis 218 that is perpendicular to the first axis 216. As shown in FIG. 2, the three-terminal device 208 is coupled to the first electrical connector 206 along the second axis 218. It should additionally be noted that the gate of the three-terminal device 208 extends along another axis 222 that is perpendicular to both the first axis 216 and the second axis 218. The portion of the first electrical connector 206 that extends along the first axis 216 is utilized to provide electrical current to the source of the three-terminal device 208.

Those skilled in the art will recognize that a MESFET can be a completely symmetric device and its source and drain terminals be defined only after voltage levels are applied. In such, a MESFET will support current flow in two directions through the memory cell element.

The macro cell 200 also includes a memory cell 212 that is disposed along the second axis 218 and electrically coupled to the three-terminal device 208 by a second electrical connector 210. The second electrical connector 210 is coupled to both the drain of the three-terminal device 208, if the three-terminal device 208 is a MESFET, as well as the memory element. The memory cell 212 is also coupled to a third electrical connector 214. The third electrical connector 214 extends both along the second axis 218 and along a third axis 220 that is perpendicular to both the first axis 216 and the second axis 218. Another electrically insulating spacer 204 is coupled to the third electrical connector 214 to electrically insulate the macro cell 200 from adjacent macro cells.

To address the macro cell 200, electrical voltage or current is applied to three distinct locations of the macro cell 200. First, electrical voltage or current is applied to the first electrical connector 206. Second, electrical voltage or current is applied to the gate of the three-terminal device 208 if the three-terminal device 208 is a MESFET. Third, electrical voltage or current is applied to the third electrical connector 214. When all three voltage or currents are applied to the same macro cell 200, then the macro cell 200 is addressed such that data may be written or read from the memory cell 212. Memory cell 212 in this illustrative description represents the PCM cell and its heater, but other memory cell elements could be used such as magnetoresitive memory elements, or other variable resistance elements as well.

Figure 3:
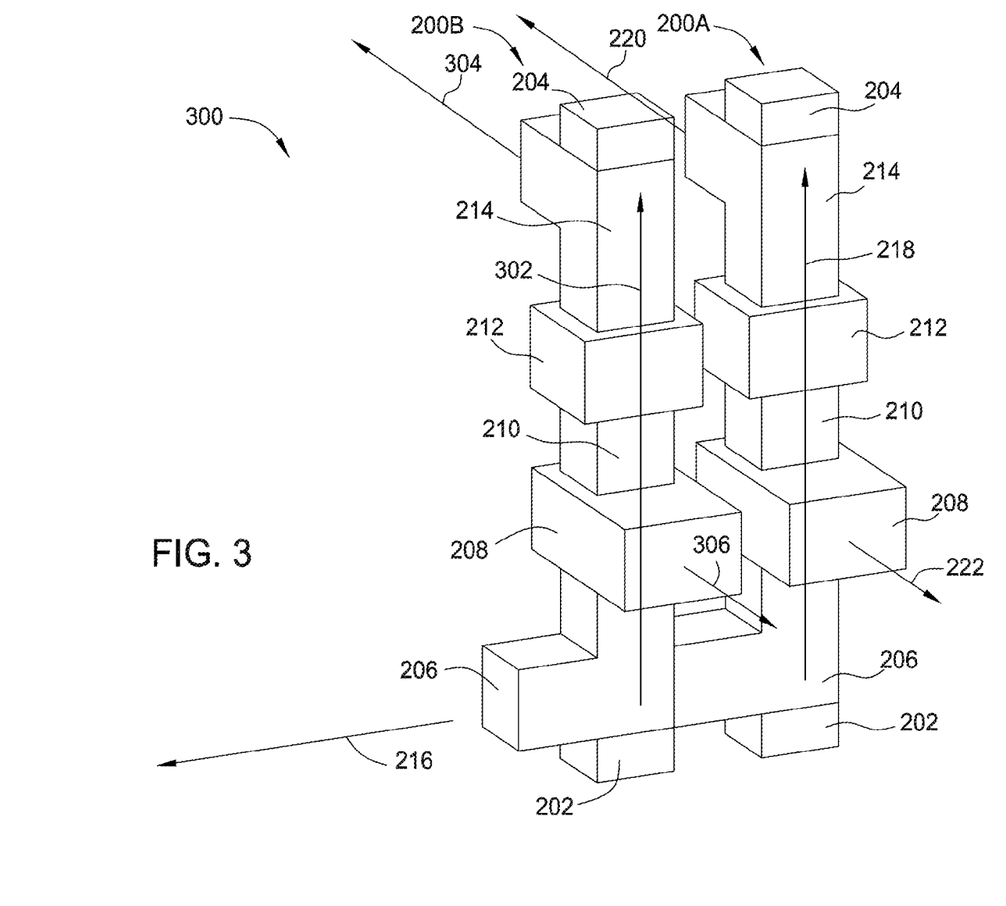
FIG. 3 is an isometric view of a PCM-based building block array 300 having two macro cells 200A, 200B arranged side by side.

FIG. 3 is an isometric view of a PCM-based building block array 300 having two macro cells 200A, 200B arranged side by side. As can be seen from FIG. 3, each macro cell 200A, 200B contains electrically insulating spacers 202, 204, first electrical connectors 206, selecting three-terminal device 208, second electrical connectors 210, memory cells 212, and third electrical connectors 214. However, while the first electrical connector 206 of one of the macro cells 200A extends along both the first axis 216 and the second axis 218, the first electrical connector 206 of the other macro cell 200B extends along the first axis 216 and another axis 302 that is parallel to the second axis 218 and perpendicular to the first axis 216. Additionally, the third electrical connector 218 of one macro cell 200B extends along an axis 304 that is parallel to the third axis 220. Finally, the selecting three-terminal device 208 of one macro cell 200B extends along an axis 306 that is parallel to the axis 222 that the three-terminal device 208 of the other macro cell 200A extends along.

In addition to extending along the first axis 216, the first electrical connectors 206 of both macro cells 200A, 200B are electrically connected together. Thus, when electrical current is applied to the first electrical connector 206 of one macro cell 200A, electrical current is also applied to the first electrical connector 206 of the other macro cell 200B. Additionally, when electrical current is applied to the first electrical connectors 206, electrical current is also applied to the source of the three-terminal devices 208 of both macro cells 200A, 200B.

Figure 4:
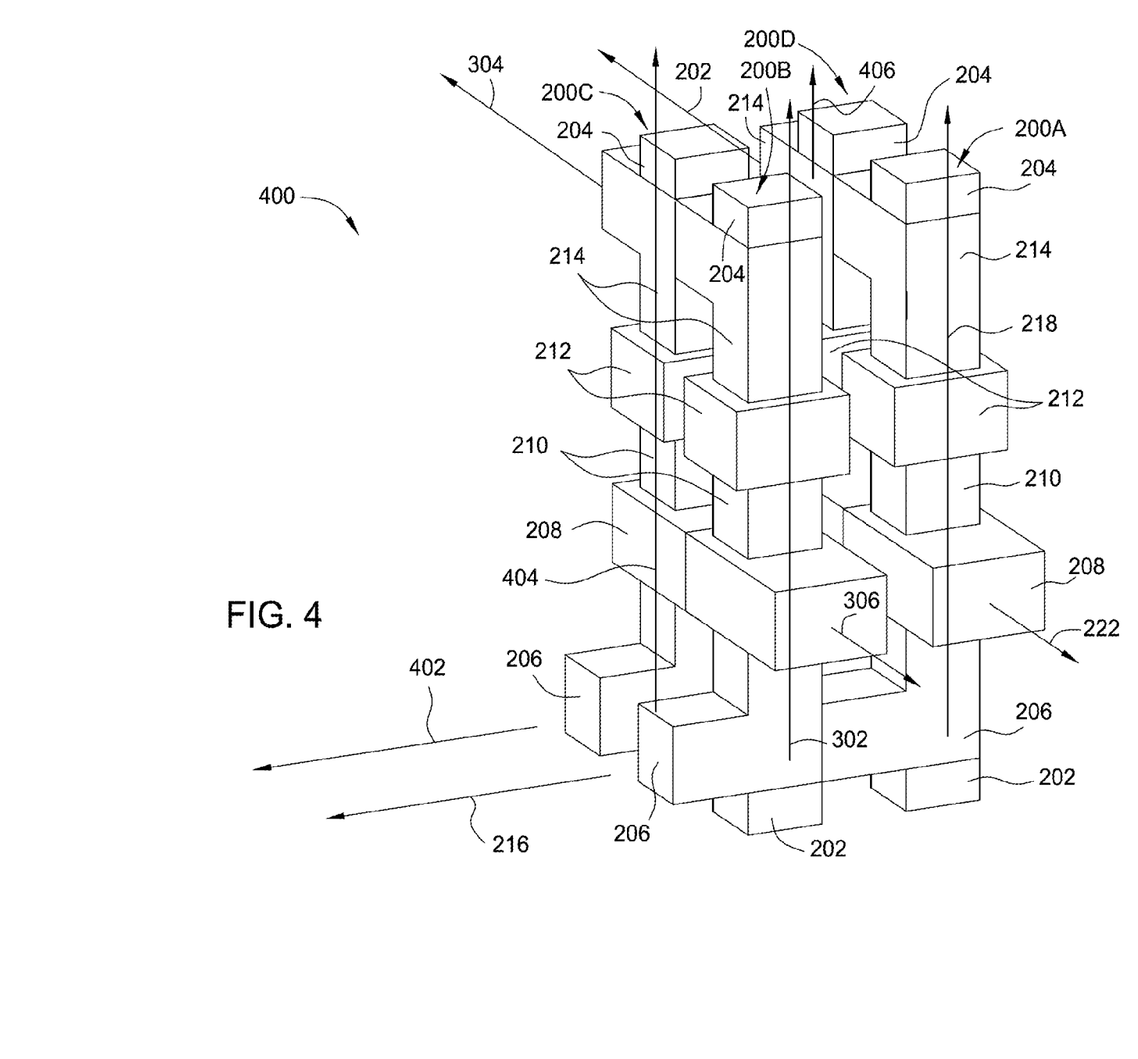
FIG. 4 is a schematic isometric view of a PCM-based memory building block array 400 having a plurality of macro cells 200A-200D arranged side by side.

FIG. 4 is a schematic isometric view of a PCM-based memory building block array 400 having a plurality of macro cells 200A-200D arranged side by side. Macro cells 200A, 200B are as discussed above with regards to FIG. 3, but two additional macro cells 200C, 200D have been added. Similar to macro cells 200A, 200B, macro cells 200C, 200D each have electrically insulating spacers 202, 204, first electrical connectors 206, three-terminal devices 208, second electrical connectors 210, memory cells 212, and third electrical connectors 214. However, the first electrical connectors 206 for macro cells 200C, 200D are along a different axis 402 as compared to the first axis 216 upon which the first electrical connectors 206 for macro cells 200A, 200B extend. Additionally, the first electrical connectors 206 for both macro cell 200C and 200D extend along axis 404, 406 that are parallel to axis 218, 302.

The third electrical connectors 214 for macro cells 200A, 200D extend along a common axis 220 and are electrically connected together. The third electrical connectors 214 for macro cells 200B, 200C extend along a common axis 304 and are electrically connected together. However, the third electrical connectors 214 for macro cells 200A, 200D are not electrically connected to the third electrical connectors 214 for macro cells 200B, 200C. Additionally, the three-terminal devices 208 for macro cells 200A, 200D extend along a common axis, axis 222 and are electrically connected together. The three-terminal devices 208 for macro cells 200B, 200C extend along a common axis 306 and are electrically connected together. However, the three-terminal devices 208 for macro cells 200A, 200D are not electrically connected to the three-terminal devices 208 for macro cells 200B, 200C.

Figure 5:
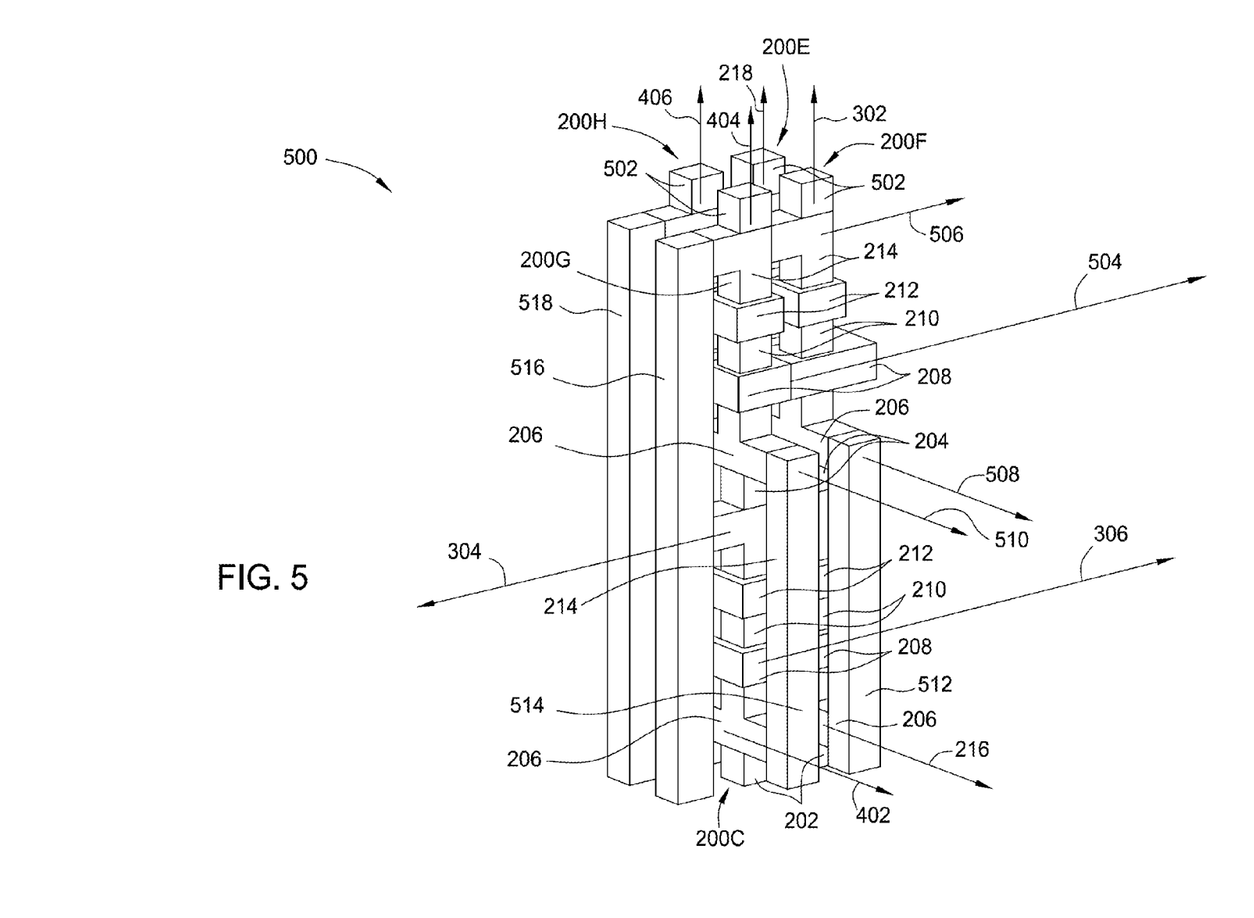
FIG. 5 is a schematic isometric view of a 3D PCM-based memory array 500 having a plurality of macro cells 200A-200H.

A PCM-based building block can be arranged in more than one plane so that a 3D PCM memory array is fabricated. FIG. 5 is a schematic isometric view of a 3D PCM-based memory array 500 having a plurality of macro cells 200A-200H. The array 500 shows the macro cells 200A-200D rotated counterclockwise 90 degrees from the view shown in FIG. 4. Four additional macro cells 200E-200H are shown, but the macro cells 200E-200H are disposed over the macro cells 200A-200D and are electrically isolated from macro cells 200A-200D by electrically insulating spacers 204. It is contemplated that additional macro cells could be formed above macro cells 200E-200H and would be electrically isolated by electrically insulating spacers 502.

As shown in FIG. 5, the first electrical connectors 206 for macro cells 200E, 200F extend along an axis 508 that is parallel to axis 216. Additionally, the first electrical connectors 206 for macro cells 200E, 200F are electrically coupled to the first electrical connectors 206 for macro cells 200A, 200B by element 512. It is to be understood that element 512 comprises electrically conductive material such as wiring that connects the first electrical connectors 206 to transistors in the substrate. The first electrical connector 206 for macro cell 200E extends along axis 218, and the first electrical connector 206 for macro cell 200F extends along axis 302.

As also shown in FIG. 5, the first electrical connectors 206 for macro cells 200G, 200H extend along an axis 510 that is parallel to axis 402. Additionally, the first electrical connectors 206 for macro cells 200G, 200H are electrically coupled to the first electrical connectors 206 for macro cells 200C, 200D by element 514. It is to be understood that element 514 comprises electrically conductive material such as wiring that connects the first electrical connectors 206 to transistors in the substrate. The first electrical connector 206 for macro cell 200G extends along axis 404, and the first electrical connector 206 for macro cell 200H extends along axis 406.

As also shown in FIG. 5, the third electrical connectors 214 for macro cells 200F, 200G extend along an axis 506 that is parallel to axis 304. Additionally, the third electrical connectors 214 for macro cells 200F, 200G are electrically coupled to the third electrical connectors 214 for macro cells 200B, 200C by element 516. It is to be understood that element 516 comprises electrically conductive material such as wiring that connects the third electrical connectors 214 to transistors in the substrate. The third electrical connector 214 for macro cell 200F extends along axis 302, and the third electrical connector 214 for macro cell 200G extends along axis 404.

It is to be understood that the third electrical connectors 214 for macro cells 200E, 200H extend along an axis that is parallel to axis 220. Additionally, the third electrical connectors 214 for macro cells 200E, 200H are electrically coupled to the third electrical connectors 214 for macro cells 200A, 200D by element 518. Element 518 comprises electrically conductive material such as wiring that connects the third electrical connectors 214 to transistors in the substrate. The third electrical connector 214 for macro cell 200E extends along axis 218, and the third electrical connector 206 for macro cell 200H extends along axis 406.

The three-terminal devices 208 of macro cells 200F, 200G extend along a common axis 504 that is parallel to axis 306 and are electrically coupled together. Similarly, MESFETs 208 of macro cells 200E, 200H extend along a common axis that is parallel to axis 222 and are electrically coupled together.

FIGS. 6A-6D are schematic isometric illustrations of a 3D PCM-based array 600 according to one embodiment. In the embodiment shown, the PCM array 600 includes four separate levels of macro cells with a total of sixty-four macro cells per level. Within each level, there are eight rows 602 that extend in a first direction and eight rows 604 that extend in a second direction perpendicular to the first direction. Each of the rows 602 is coupled to a corresponding element that comprises electrically conductive material, such as wiring, to connect the third electrical connectors 214 to transistors in the substrate. While only two elements 516, 518 have been shown, it is to be understood that each row 602 has a corresponding element for electrical connection and that each element is connected to each third electrical connector 214 within the entire row 602. Thus, eight elements would be present for the embodiment shown in FIGS. 6A-6D, but for clarity, only elements 516, 518 have been shown. Additionally, it is understood that the third electrical connectors 214 within a common row 602 in one level are electrically connected to the third electrical connectors 214 within the same row that are on a different level. Similarly, each of the rows 604 is coupled to a corresponding element that comprises electrically conductive material, such as wiring, to connect the first electrical connectors 206 to transistors in the substrate. While only two elements 512, 514 have been shown, it is to be understood that each row 604 has a corresponding element for electrical connection and that each element is connected to each first electrical connector 206 within the entire row 604. Thus, eight elements would be present for the embodiment shown in FIGS. 6A-6D, but for clarity, only elements 512, 514 have been shown. Additionally, it is understood that the first electrical connectors 206 within a common row 604 in one level re electrically connected to the first electrical connectors 206 within the same row that are on a different level.

Figures 6A, 6B:
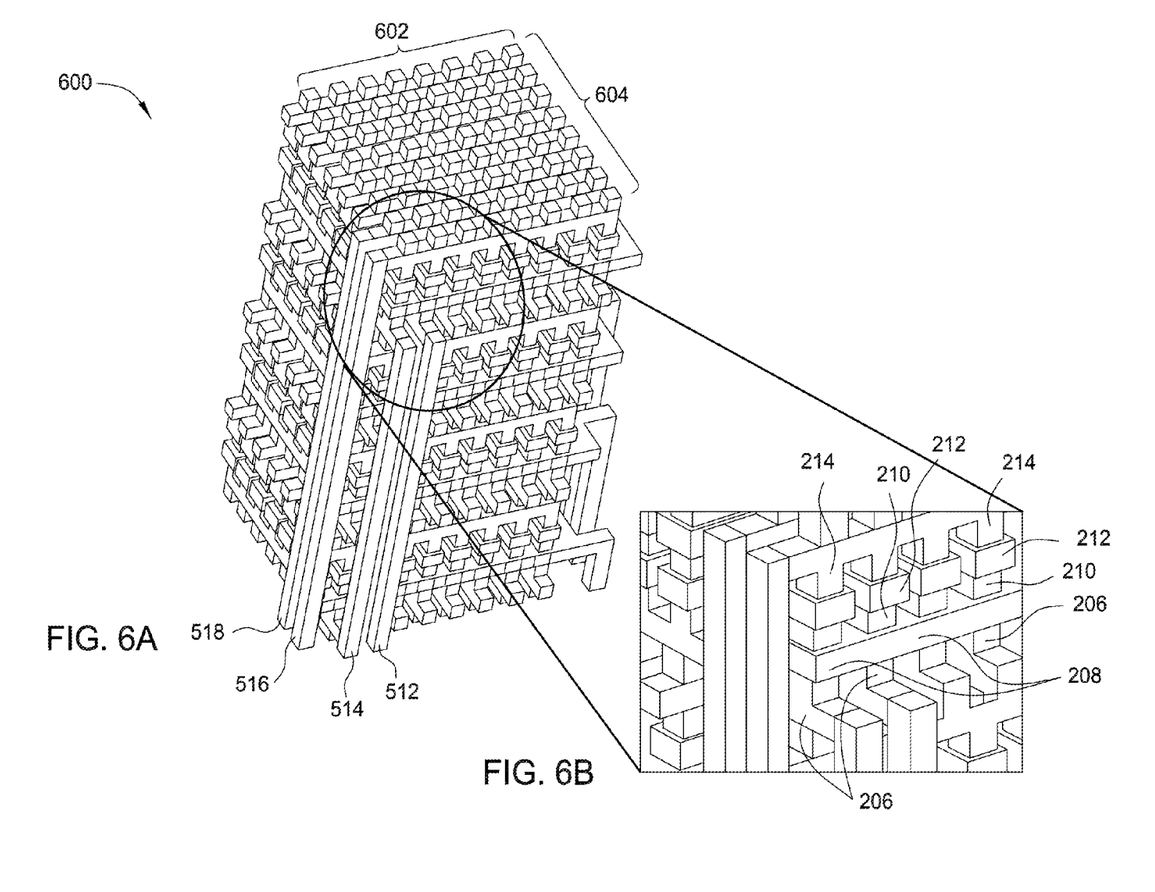
FIGS. 6A-6D are schematic isometric illustrations of a 3D PCM-based array 600 according to one embodiment.
Figures 6C, 6D:
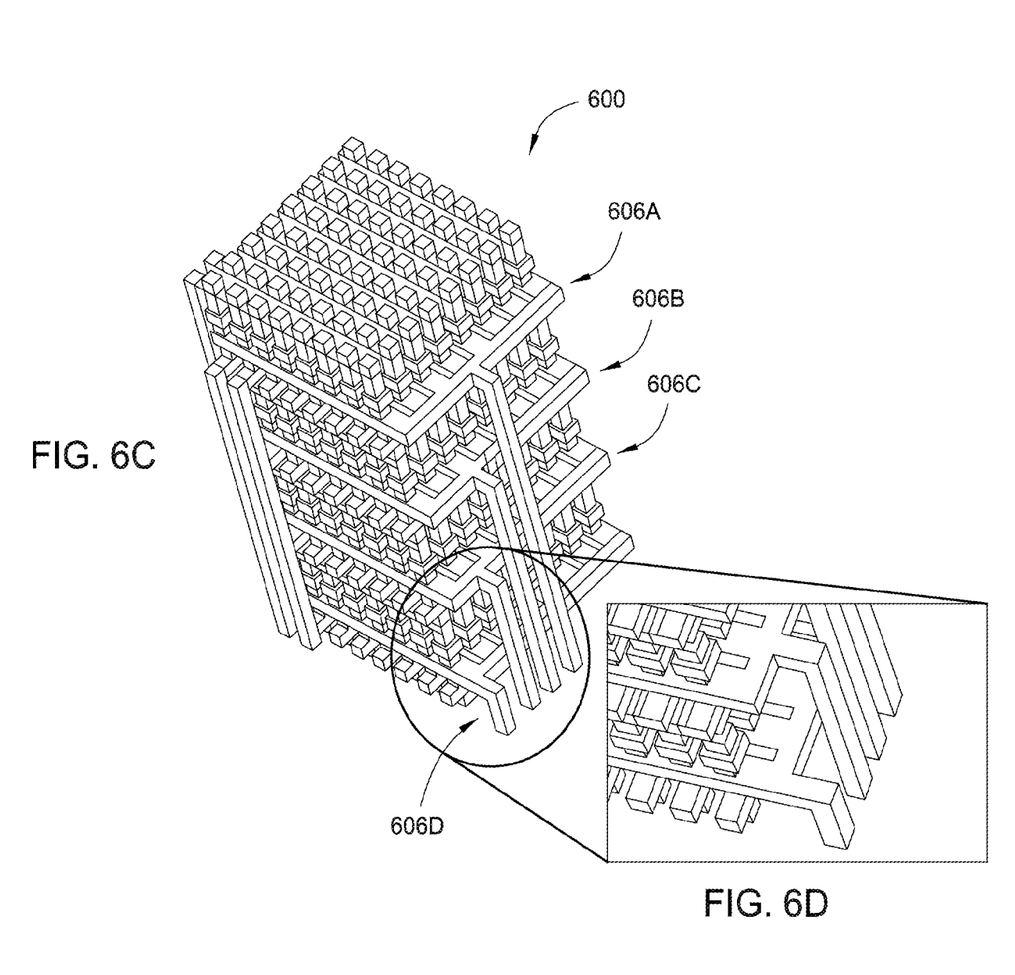

For the three-terminal devices 208, all of the three-terminal devices 208 within a common level are electrically coupled together as shown in FIGS. 6C and 6D. All of the three-terminal devices 208 within a given level electrically couple together with electrical connectors 606A-606D, such as wiring, that spans across the level and then down to the substrate to provide electrical connection to a transistor. In the embodiment shown in FIGS. 6A-6D, there are four levels and hence, only four electrical connections to the transistors on the substrate for the three-terminal devices 208. By selecting one row 602, one row 604 and one electrical connector 606A-606D, a single macro cell 200 can be addressed.

For the embodiment shown in FIGS. 6A-6D, the PCM array 600 is an 8×8×4 3D arrangement of macro cells, but it is contemplated that any electrically programmable/readable memory cell, as opposed to a PCM cell, may be arranged in such a manner. Each macro cell 200 is addressed by the interception of three planes. Therefore, the overhead wiring is minimal. For the footprint over the substrate, an additional 2FNx area (for the x-direction planes), 2FNy area (for the y-direction planes) and 4FNz area (for the z-direction planes), where F is the half pitch critical dimension for the lithography used, Nx, Ny and Nz are the number of cells in the x, y, and z dimensions, is all that is required for addressing any cell in the full 3D structure. Therefore, the number of memory cells grows with NxNyNz (i.e., $N^3$) whereas the footprint overhead for addressability is a linear function of Nx, Ny and Nz.

For the embodiment shown in FIGS. 6A-6D, a total of 256 macro cells 200 are present, yet only 20 transistors are necessary on the substrate to address each macro cell 200 individually. Rather than providing three separate electrical connections to each macro cell, which would necessitate 768 transistors, the macro cells 200 can share transistors, yet be uniquely addressed. Because only 20 transistors are necessary on the substrate, the PCM array 600 utilizes a very small amount of substrate area outside of the footprint of the PCM array 600. Additionally, no overhead wiring is necessary to address the macro cells 200 in the middle of the PCM array 600. One can easily imagine that if 768 transistors were utilized, electrically connecting the 768 transistors to the macro cells 200 would be quite complex. Even if the macro cells 200 were stacked in a 3D arrangement, electrically connecting 768 transistors to the PCM array 600 would be much more complex than connecting 20 transistors external to the 3D memory cell array. Thus, the 3D PCM array arrangement disclosed herein provides a much less complex wiring strategy, utilizes fewer transistors, and has a smaller footprint over the substrate.

The PCM arrays disclosed herein are scalable 3D arrangements. It is to be understood that the description herein is not limited to PCMs, but rather is applicable to any memory with memory cell elements queried by current and it uses a small footprint even in the case where a high current 3D access (i.e., selecting) device capability is a requirement. The embodiments disclosed herein are scalable, yet have a low footprint overhead with regards to the 3D architectural arrangement of the cells. The wiring that is over the entire cell is minimal to query a macro cell in the middle of the 3D cell and thus diminishes the overhead contribution to the footprint of the device.

Figure 7A:
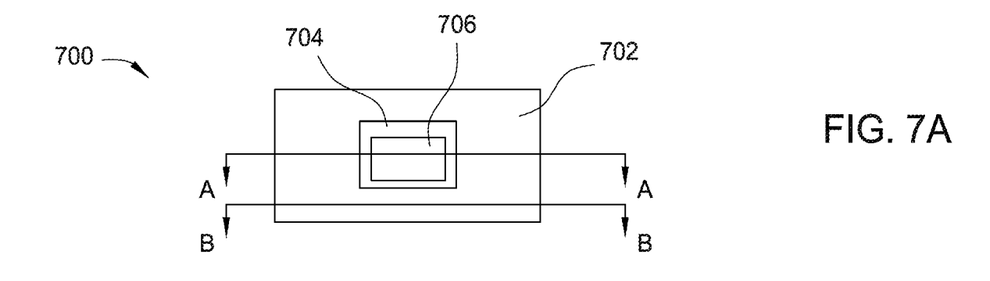
FIGS. 7A-7C are schematic illustrations of a metal semiconductor field effect transistor (MESFET) 208 according to one embodiment.
Figure 7B:
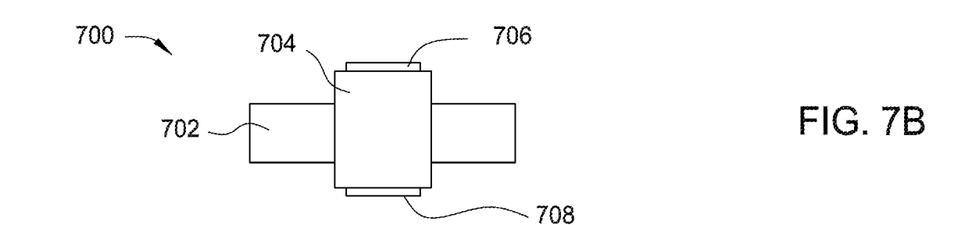
Figure 7C:
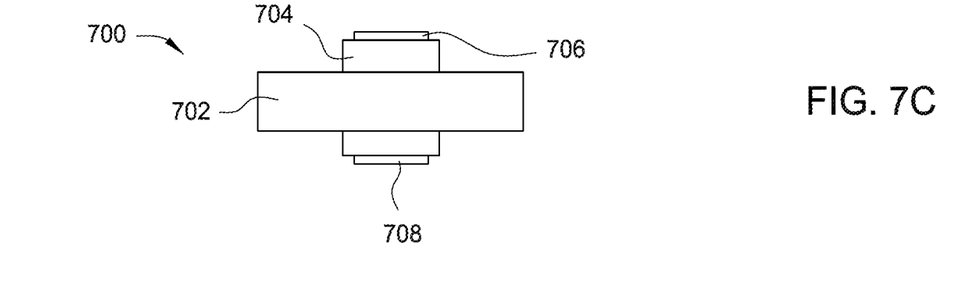

FIGS. 7A-7C are schematic illustrations of a MESFET three-terminal device 208 according to one embodiment. FIG. 7B is a cross-sectional view taken along line A-A from FIG. 7A, and FIG. 7C is a cross-sectional view taken along line B-B from FIG. 7A. The MESFET includes a surrounding gate electrode 702 and a channel 704. The surrounding gate electrode 702 comprises a noble metal such as the noble metals that make schottky junctions with the channel 704. The channel 704 comprises polysilicon. A source electrode 708 is shown as is a drain electrode 706. The source electrode 708 is simply the first electrical connector 206 while the drain electrode 706 is the second electrical connector 210 from the macro cell 200. The electric current flows from source 708 to drain 706 of the MESFET as a function of the voltage or current applied to the gate electrode 702. Depending on the three-terminal device being designed as enhancement or depletion operation, a zero voltage applied to the gate electrode relative to source will allow current flow from source to drain. In the case of an enhancement MESFET, its necessary gate voltages differ from zero voltage to allow current flow from source to drain. A depletion mode MESFET will allow current to flow from source to drain with a zero voltage from gate to source, while current flow is blocked by changing the gate voltage to some other finite value. The current then flows from the drain electrode 706 to the memory cell 212. Because the MESFET 208 is a surround gate MESFET, the surrounding gate electrode 702 can be arrayed across a plurality of macro cells 200 as shown in FIGS. 6A-6D and permit control of the 'on' or 'off' of the MESFET from a single external contact. The channel 704 comprises polysilicon and can be either n-type or p-type. Because the channel 704 is doped, the channel 704 will be more conductive than diode devices of comparable cross section area. Polysilicon is also chosen as the channel 704 because of the limited thermal budget requirements in back-end processing for PCM cells over a substrate prefabricated with standard CMOS transistors. Polysilicon is advantageous over other alternatives because polysilicon is fully compatible with standard CMOS fabrication processes and can take advantage of volume production of already established CMOS fabs.

A method for addressing a PCM cell will now be discussed with reference to the Figures. Initially, a particular macro cell 200 is chosen. Then, current is applied to a plurality of first electrical connectors 206, a plurality of third electrical connectors 214 and a plurality of gate electrodes 702 of a plurality of MESFETs 208. A total of three transistors are utilized to apply the electrical currents, yet numerous macro cells 200 receive the electrical current. However, only one macro cell 200 receives all three currents. The current applied to the plurality of first electrical connectors 206 is applied to a plurality of first electrical connectors 206 that lie in a common plane and are all electrically coupled together. The current applied to the plurality of first electrical connectors 206 may be thought of as the "X" coordinate in an "X-Y-Z" 3D orientation.

The current applied to the plurality of third electrical connectors 214 is applied to a plurality of third electrical connectors 214 that lie in a common plane and are all electrically coupled together. The third electrical connectors 214 to which the current is applied lie in a plane that is perpendicular to the plane in which the first electrical connectors that have current applied thereto lie. The current applied to the third electrical connectors 214 may be thought of as the "Y" coordinate in an "X-Y-Z" 3D orientation.

In a 3D structure, identifying only two coordinates does not result in a single location, but, rather, multiple locations within the "Z" plane. Thus, the "Z" coordinate is necessary. Similarly, to address a single macro cell 200, the third current is applied to the gate electrode 702 of a plurality of MESFETs 208. The current applied to the gate electrodes 702 of the plurality of MESFETs 208 may be thought of as the "Z" coordinate in an "X-Y-Z" 3D orientation. The plurality of MESFETS 208 that have current applied thereto lie in a common plane which is perpendicular to each of the planes to which the first and third electrical connector 206, 214 having electrical current applied thereto lie. The three currents, while applied to multiple first electrical connectors 206, multiple third electrical connectors 214, and multiple MESFETs 208 are collectively applied to only one specific macro cell 200.

The PCM cells disclosed herein are scalable 3D arrangements. It is to be understood that the description herein is not limited to PCMs, but rather is applicable to any memory with memory cell elements queried by current. It uses small footprint even in the case where high current 3D access (i.e., selecting) device capability is a requirement. The embodiments disclosed herein are scalable, yet have a low footprint overhead with regards to the 3D architectural arrangement of the cells. The wiring that is over the entire cell is minimal to query a macro cell in the middle of the 3D cell and thus diminishes the overhead contribution to the footprint of the device. The 3D design, and the use of a surround gate MESFET, permits a single macro cell to be addressed while applying voltage to multiple macro cells.

While the foregoing is directed to embodiments of the present invention, other and further embodiments of the invention may be devised without departing from the basic scope thereof, and the scope thereof is determined by the claims that follow.

What is claimed is:

1. A three-dimensional memory array, comprising:
    a first memory cell coupled to a first three terminal device along a first axis; and
    a second memory cell coupled to a second three terminal device along a second axis, wherein:
        the first three terminal device and the second three terminal device are each coupled to a first electrical connection along a third axis, the third axis perpendicular to the first axis and the second axis;
        the first axis and the second axis are parallel;
        a second electrical connection is coupled to the first memory cell along the first axis, the second electrical connection also extends along a fourth axis perpendicular to the first axis and the third axis; and
        a third electrical connection is coupled the second memory cell along the second axis, the third electrical connection also extends along a fifth axis perpendicular to the first axis and the second axis and parallel to the fourth axis.

2. The three-dimensional memory array of claim 1, further comprising:
    a third memory cell coupled to a third three terminal device, wherein the first three terminal device and the third three terminal device are each coupled to a fourth electrical connection.

3. The three-dimensional memory array of claim 2, wherein the third three terminal device and the second three terminal device are each coupled to a fifth electrical connection.

4. The three-dimensional memory array of claim 3, wherein the first three terminal device is coupled to a sixth electrical connection.

5. The three-dimensional memory array of claim 4, wherein the second three terminal device is coupled to a seventh electrical connection.

6. The three-dimensional memory array of claim 5, wherein the third three terminal device is coupled to an eighth electrical connection.

7. The three-dimensional memory array of claim 6, wherein the first three terminal device is a MESFET.

8. The three-dimensional memory array of claim 7, wherein the second three terminal device is a MESFET.

9. The three-dimensional memory array of claim 8, wherein the third three terminal device is a MESFET.

10. The three-dimensional memory array of claim 9, wherein the first memory cell is a phase change memory cell.

11. The three-dimensional memory array of claim 10, wherein the second memory cell is a phase change memory cell.

12. The three-dimensional memory array of claim 11, wherein the third memory cell is a phase change memory cell.

13. The three-dimensional memory array of claim 9, wherein the first memory cell is a tunnel magneto-resistive cell.

14. The three-dimensional memory array of claim 13, wherein the second memory cell is a tunnel magneto-resistive cell.

15. The three-dimensional memory array of claim 14, wherein the third memory cell is a tunnel magneto-resistive cell.

* * * * *